US011367629B2

(12) United States Patent
Tanaka

(10) Patent No.: US 11,367,629 B2
(45) Date of Patent: Jun. 21, 2022

(54) CLEANING APPARATUS OF CLEANING TOOL, SUBSTRATE PROCESSING APPARATUS, AND CLEANING METHOD OF CLEANING TOOL

(71) Applicant: Ebara Corporation, Tokyo (JP)

(72) Inventor: Hideaki Tanaka, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 50 days.

(21) Appl. No.: 16/750,138

(22) Filed: Jan. 23, 2020

(65) Prior Publication Data

US 2020/0243351 A1 Jul. 30, 2020

(30) Foreign Application Priority Data

Jan. 30, 2019 (JP) .............................. JP2019-014133

(51) Int. Cl.
| | | |
|---|---|---|
| *H01L 21/67* | (2006.01) | |
| *A46B 17/06* | (2006.01) | |
| *B08B 5/04* | (2006.01) | |
| *H01L 21/02* | (2006.01) | |
| *B08B 1/04* | (2006.01) | |
| *A46B 13/00* | (2006.01) | |

(52) U.S. Cl.
CPC ........ *H01L 21/67046* (2013.01); *A46B 17/06* (2013.01); *B08B 5/04* (2013.01); *H01L 21/02096* (2013.01); *A46B 13/001* (2013.01); *A46B 2200/30* (2013.01); *B08B 1/04* (2013.01); *H01L 21/67219* (2013.01)

(58) Field of Classification Search
CPC ........... B08B 1/007; B08B 1/04; B08B 1/002; B08B 1/001–006; B24B 53/017; H01L 21/67046; H01L 21/02–02076; H01L 21/00–86; H01L 21/02096; A46B 13/001–006
See application file for complete search history.

(56) References Cited

U.S. PATENT DOCUMENTS

| 5,745,945 A | 5/1998 | Manfredi et al. |
| 6,039,635 A * | 3/2000 | Mitsuhashi ........... B24B 53/017 451/288 |

(Continued)

FOREIGN PATENT DOCUMENTS

| CN | 104334290 A | 2/2015 |
| JP | S63-239953 A | 10/1988 |

(Continued)

OTHER PUBLICATIONS

"Generator, n." OED Online, Oxford University Press, Sep. 2021, www.oed.com/view/Entry/77525. (Year: 2021).*

(Continued)

*Primary Examiner* — Mikhail Kornakov
*Assistant Examiner* — Richard Z. Zhang
(74) *Attorney, Agent, or Firm* — Abelman, Frayne & Schwab

(57) ABSTRACT

A cleaning apparatus for cleaning a cleaning tool that scrub-cleans a substrate includes a cleaning body. The cleaning body includes a contact portion configured to come into contact with the cleaning tool, and the contact portion includes a suction area configured to remove foreign matter from the cleaning tool.

19 Claims, 9 Drawing Sheets

(56) References Cited

U.S. PATENT DOCUMENTS

| | | | | |
|---|---|---|---|---|
| 6,158,075 | A | * 12/2000 | Tanaka | H01L 21/67046 15/102 |
| 6,579,797 | B1 | 6/2003 | Crevasse et al. | |
| 7,544,113 | B1 | * 6/2009 | Benner | B24B 53/00 451/21 |
| 2011/0209727 | A1 | * 9/2011 | Wang | H01L 21/67046 134/6 |
| 2014/0331440 | A1 | 11/2014 | Ishibashi | |
| 2016/0243593 | A1 | * 8/2016 | Tanaka | B08B 1/04 |
| 2020/0101580 | A1 | * 4/2020 | Wei | B24B 53/00 |

FOREIGN PATENT DOCUMENTS

| | | |
|---|---|---|
| JP | H08-39014 A | 2/1996 |
| JP | H09-36076 A | 2/1997 |
| JP | H09-92633 A | 4/1997 |
| JP | H10-209094 A | 8/1998 |
| JP | H10-223583 A | 8/1998 |
| JP | H10223583 * | 8/1998 |
| JP | H10-323631 A | 12/1998 |
| JP | H11-288912 A | 10/1999 |
| JP | 2000-150441 A | 5/2000 |
| JP | 2001-121096 A | 5/2001 |
| JP | 2003-243350 A | 8/2003 |
| JP | 2006-339434 A | 12/2006 |
| JP | 2007-160301 A | 6/2007 |
| JP | 2007-201427 A | 8/2007 |
| JP | 2008-311481 A | 12/2008 |
| JP | 2013-508969 A | 3/2013 |
| JP | 2016-152345 A | 8/2016 |
| JP | 2016-167514 A | 9/2016 |
| JP | 2017-045836 A | 3/2017 |

OTHER PUBLICATIONS

"Groove, n." OED Online, Oxford University Press, Sep. 2021, www.oed.com/view/Entry/81733. (Year: 2021).*

"Switch, n." OED Online, Oxford University Press, Sep. 2021, www.oed.com/view/Entry/195965. (Year: 2021).*

* cited by examiner

CLEANING APPARATUS OF CLEANING TOOL, SUBSTRATE PROCESSING APPARATUS, AND CLEANING METHOD OF CLEANING TOOL

CROSS-REFERENCE TO RELATED APPLICATIONS

This application is based on and claims priority from Japanese Patent Application No. 2019-014133, filed on Jan. 30, 2019, with the Japan Patent Office, the disclosure of which is incorporated herein in their entireties by reference.

TECHNICAL FIELD

The present invention relates to a cleaning apparatus of a cleaning tool, a substrate processing apparatus, and a method of cleaning a cleaning tool.

BACKGROUND

A substrate processing apparatus described in Japanese Laid-Open Patent Publication No. 10-223583 has been known in the related art. The substrate processing apparatus is a chemical mechanical polishing (CMP) apparatus that flatly polishes the surface of a substrate such as, for example, a silicon wafer, and includes a polishing unit configured to polish the substrate and a cleaning unit configured to clean the substrate. The cleaning unit includes, for example, a brush (cleaning member) having a plurality of bristle-like bodies on the peripheral wall of a cylindrical main body, and is provided with a substrate cleaning apparatus for scrub-cleaning the substrate by rotating the substrate together with the brush while supplying a cleaning liquid to the substrate.

In such a substrate cleaning apparatus, a portion of contaminant attached to the substrate may not be washed away by the cleaning liquid but may be attached and deposited to the brush. Thus, there is a concern that the cleaning effect may be reduced, and the contaminant may be re-attached to the substrate. For this reason, in the substrate cleaning apparatus of Japanese Laid-Open Patent Publication No. 10-223583, a plate-shaped scraper is provided for self-cleaning (self-cleaning) the brush, the plate-shaped scraper is brought into contact with the rotating brush, a plurality of ejection holes is provided in the portion that comes into contact with the plate-shaped scraper, and the cleaning liquid is supplied from the ejection holes, thereby removing the contaminants attached to the brush.

SUMMARY

In the related art, since the plate-shaped scraper is brought into contact with the rotating brush, it is possible to forcibly scrape off the contaminants from the brush. However, the scraped contaminants are basically premised on flowing along with the cleaning liquid, and there is a problem in that it is impossible to eliminate the concern of reattachment to the substrate or brush.

For this reason, the related art described above proposes, as a modification, a method, in which, instead of the ejection holes, a suction hole is provided in the vicinity of one edge of the plate-shaped scraper to scrape off contaminants attached to and deposited on the brush, and to vacuum-suction the contaminants together with the cleaning liquid (see, e.g., FIG. 5 of Japanese Laid-Open Patent Publication No. 10-223583).

However, since the vicinity of one end of the plate-shaped scraper of the prior art is formed as a curved surface in order to reduce damage to the brush due to contact and the brush has a plurality of protrusions, a gap is easily formed between the plate-shaped scraper and the brush, and only ambient air is suctioned from the suction hole. Thus, there is a possibility that it is difficult to efficiently suction and remove the scraped contaminants and the cleaning liquid.

The present disclosure has been made in view of the problems described above, and the present disclosure provides a substrate cleaning apparatus, a substrate processing apparatus, and a cleaning member self-cleaning method capable of efficiently suctioning and removing contaminants attached to the cleaning member.

(1) According to an aspect of the present disclosure, a cleaning apparatus is provided for cleaning a cleaning tool that scrub-cleans a substrate. The cleaning apparatus includes a cleaning body including a contact portion configured to come into contact with the cleaning tool. The contact portion of the cleaning body includes a suction area configured to remove foreign matter from the cleaning tool.

(2) In the cleaning apparatus of (1), the contact portion may be formed by a flat surface.

(3) In the cleaning apparatus of (1) or (2), the cleaning tool may be a cleaning roll configured to perform scrub-cleaning the substrate while rotating the substrate.

(4) In the cleaning apparatus of (3), the suction area may include a slit groove extending in a rotation axis direction of the cleaning roll, and a plurality of suction holes arranged in a bottom surface of the slit groove at intervals in the rotation axis direction.

(5) In the cleaning apparatus of (4), the slit groove may have a length shorter than a length of the cleaning roll in the rotation axis direction.

(6) In the cleaning apparatus of (4) or (5), the slit groove may have a length longer than a length of the substrate in the rotation axis direction.

(7) In the cleaning apparatus of any one of (4) to (6), the cleaning roll may include a plurality of protrusions formed on a peripheral surface thereof, and the slit groove may have a width smaller than a width of each of the protrusions in a direction orthogonal to the rotation axis direction.

(8) In the cleaning apparatus of any one of (4) to (7), the slit groove may have an opening edge formed in a circular arc shape in which an inclination gradually increases toward the bottom surface of the slit groove in a transversal cross-sectional view across the slit groove and a longitudinal cross-sectional view through the slit groove.

(9) In the cleaning apparatus of any one of (4) to (8), the bottom face of the slit groove may be formed in a circular arc shape in which opening positions of the plurality of suction holes are deepest in a cross-sectional view across the slit groove.

(10) The cleaning apparatus of any one of (1) to (9) may further include: a contact suction tool having the contact portion and the suction area; a movement tool configured to relatively move the cleaning tool and the contact suction tool between a contact position where the cleaning tool and the contact suction tool are in contact with each other and a separation position where the cleaning tool and the contact suction tool are separated from each other; and a controller configured to control the movement tool.

(11) In the cleaning apparatus of (10), the controller may control the movement tool such that the cleaning tool and the contact suction tool come into contact with each other at least while the cleaning tool scrub-cleans the substrate.

(12) In the cleaning apparatus of (10) or (11), the controller may control the movement tool such that the cleaning tool and the contact suction tool come into contact with each other at least while the cleaning member is located at a standby position where the cleaning tool does not scrub-clean the substrate.

(13) The cleaning apparatus of any one of (1) to (12) may further includes: a contact suction tool having the contact portion and the suction area; a negative pressure generator configured to generate a negative pressure in the suction area of the contact suction tool; a positive pressure generator configured to generate a positive pressure in the suction area; a pressure gauge configured to measure the negative pressure; and a switch configured to switch a device connected to the contact suction tool between the negative pressure generator and the positive pressure generator based on a measurement result of the pressure gauge.

(14) According to another aspect of the present disclosure, a substrate processing apparatus includes a polishing unit including a polishing pad configured to polish a substrate; a cleaning unit including a cleaning tool configured to clean the substrate; and the s cleaning apparatus of (1) provided in the cleaning unit.

(15) According to still another aspect of the present disclosure, a method of cleaning a cleaning tool that scrub-cleans a substrate, is provided, which includes: providing a cleaning body including a contact portion configured to come into contact with the cleaning tool, the contact portion including a suction area; bringing the cleaning tool into contact with the contact portion; and performing suction through the suction area of the contact portion thereby removing foreign matter from the cleaning tool.

(16) In the method of (15), the cleaning tool may be brought into contact with the contact portion of the cleaning body at least while the cleaning tool scrub-cleans the substrate.

(17) In the method of (15) or (16), the cleaning tool may be brought into contact with the contact portion of the cleaning body at least while the cleaning tool is located at a standby position where the cleaning tool does not scrub-clean the substrate.

(18) In the method of any one of (15) to (17), when a negative pressure in the suction area of the contact portion is not a normal value, a positive pressure may be generated in the suction area.

According to the aspects of the present disclosure, it is possible to efficiently suction and remove contaminants attached to the cleaning member.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

Hereafter, a substrate cleaning apparatus, a substrate processing apparatus, and a cleaning member self-cleaning method according to embodiments of the present disclosure will be described with reference to the drawings. In the following description, "self-cleaning" refers to cleaning and regenerating a cleaning member (e.g., a roll cleaning member, a pencil member, or a cleaning brush) in order to suppress reattachment of particles to a substrate in a substrate cleaning apparatus which continuously performs a cleaning processing on a plurality of substrates using the cleaning member.

First Embodiment

Figure 1:
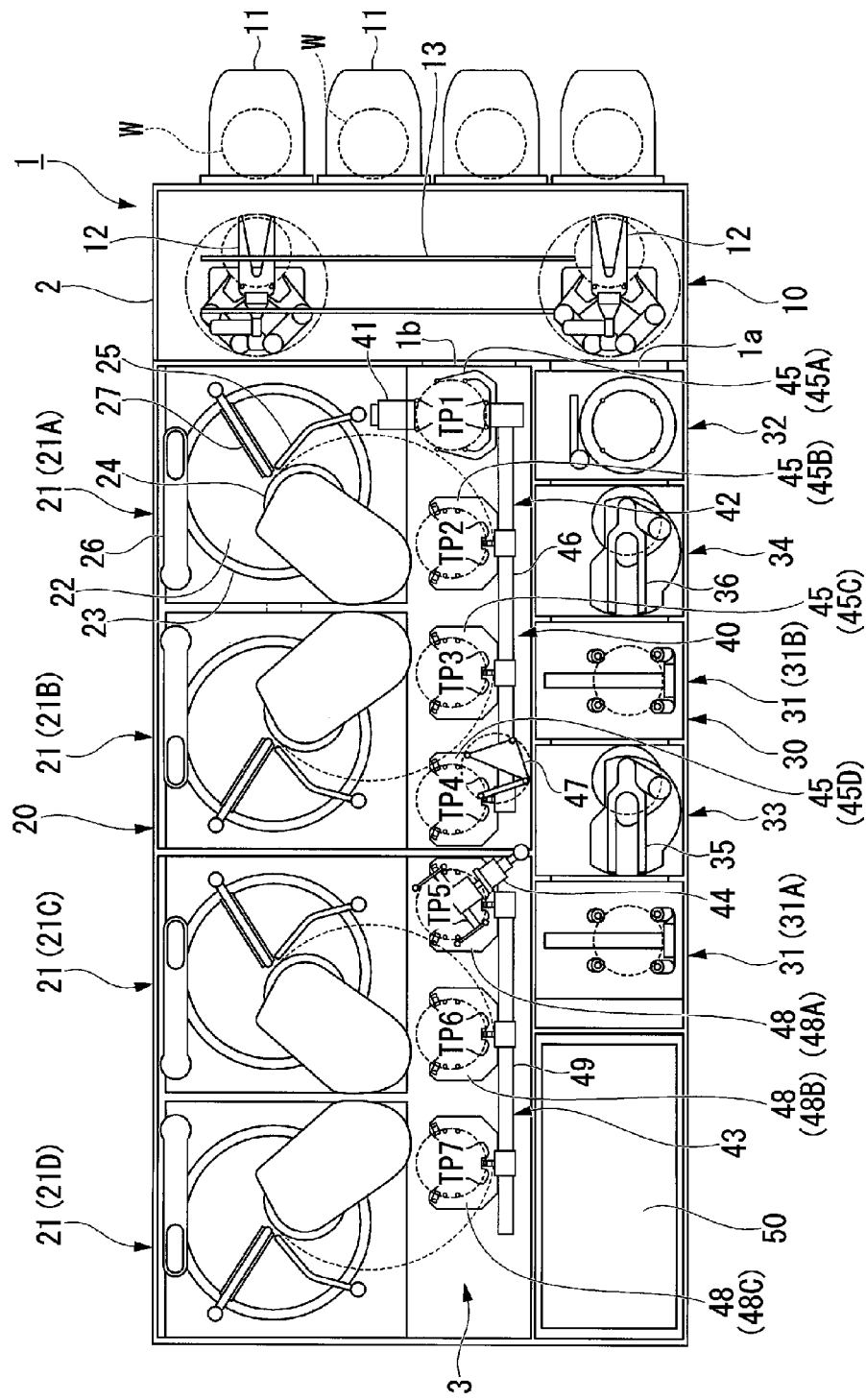
FIG. 1 is a plan view illustrating the entire configuration of a substrate processing apparatus according to a first embodiment.

FIG. 1 is a schematic plan view illustrating the entire configuration of a substrate processing apparatus 1 according to a first embodiment.

The substrate processing apparatus 1 illustrated in FIG. 1 is a chemical mechanical polishing (CMP) apparatus that flatly polishes the surface of a substrate W such as, for example, a silicon wafer. The substrate processing apparatus 1 includes a rectangular box-shaped housing 2. The housing 2 is formed in a substantially rectangular shape in a plan view.

The housing 2 includes a substrate transport path 3 extending in the longitudinal direction in the center thereof. A loading/unloading unit 10 is disposed at one end of the substrate transport path 3 in the longitudinal direction. A polishing unit 20 is disposed on one side of the width direction of the substrate transport path 3 (a direction orthogonal to the longitudinal direction in a plan view), and a cleaning unit 30 is disposed on the other side. A substrate transport unit 40 configured to transport a substrate W is provided in the substrate transport path 3. The substrate processing apparatus 1 also includes a controller 50 (control device) that comprehensively controls operations of the loading/unloading unit 10, the polishing unit 20, the cleaning unit 30, and the substrate transport unit 40.

The loading/unloading unit 10 includes a front load unit 11 that accommodates a substrate W. A plurality of front loading units 11 are provided the surface of the housing 2 on one side in the longitudinal direction. The plurality of front loading units 11 are arranged in the width direction of the housing 2. On each of the front loading units 11, for example, an open cassette, a standard manufacturing interface (SMIF) pod, or a front opening unified pod (FOUP) is mounted. The SMIF and FOUP are sealed containers in which a substrate W cassette is housed and covered with a partition wall, and is capable of maintaining an environment independent of the external space.

In addition, the loading/unloading unit 10 includes two transport robots 12 configured to load/unload substrates W into/from the front loading units 11, and a traveling mechanism 13 that allows each transfer robot 12 to travel along the front loading units 11. Each transfer robot 12 has two hands on the upper and lower sides, which are used properly before or after the processing of the substrates W, respectively. For example, when a substrate W is returned to a front loading unit 11, the upper hand is used, and when a substrate to be processed W is taken out from a front loading unit 11, the lower hand is used.

The polishing part 20 includes a plurality of substrate polishing apparatuses 21 (21A, 21B, 21C, 21D) each configured to perform polishing (planarization) of a substrate W. The plurality of substrate polishing apparatuses 21 are arranged in the longitudinal direction of the substrate transport path 3. Each substrate polishing apparatus 21 includes a polishing table 23 configured to rotate a polishing pad 22 having a polishing surface, a top ring 24 configured to hold a substrate W and polish the substrate W while pressing the substrate W against the polishing pad 22 on the polishing table 23, a polishing liquid supply nozzle 25 configured to supply a polishing liquid or a dressing liquid (e.g., pure water) to the polishing pad 22, a dresser 26 configured to perform dressing on a polishing surface of the polishing pad 22, and an atomizer 27 configured to atomize a mixed fluid of a liquid (e.g., pure water) and a gas (e.g., nitrogen gas) or a liquid (e.g., pure water) and spray the atomized mixed fluid or liquid to the polishing surface.

The substrate polishing apparatus 21 polishes the substrate W and planarizes the surface of the substrate W by pressing the substrate W against the polishing pad 22 by the top ring 24 while supplying the polishing liquid onto the polishing pad 22 from the polishing liquid supply nozzle 25, and further moving the top ring 24 and the polishing table 23 relative to each other. The dresser 26 has hard particles such as diamond particles or ceramic particles fixed to a rotating portion at the tip end thereof, which comes into contact with the polishing pad 22. The dresser 26 uniformly dresses the entire polishing surface of the polishing pad 22 and forms a flat polishing surface by rotating and rocking the rotating portion. By washing away, for example, polishing debris and abrasive grains remaining on the polishing surface of the polishing pad 22 with a high-pressure fluid, the atomizer 27 achieves purification of the polishing surface and sharpening of the polishing surface by the dresser 26, which is mechanical contact, that is, regeneration of the polishing surface.

The cleaning part 30 includes a plurality of substrate cleaning apparatuses 31 (31A, 31B) each configured to clean a substrate W, and a substrate drying apparatus 32 configured to dry the cleaned substrate W. The plurality of substrate cleaning apparatuses 31 and the substrate drying apparatus 32 are arranged in the longitudinal direction of the substrate transport path 3. A first transport chamber 33 is provided between the substrate cleaning apparatus 31A and the substrate cleaning apparatus 31B. In the first transport chamber 33, a transport robot 35 configured to transport a substrate W among the substrate transport unit 40, the substrate cleaning apparatus 31A, and the substrate cleaning apparatus 31B is provided. In addition, a second transport chamber 34 is provided between the substrate cleaning apparatus 31B and the substrate drying apparatus 32. In the second transport chamber 34, a transport robot 36 configured to transport a substrate W between the substrate cleaning apparatus 31B and the substrate drying apparatus 32 is provided.

The substrate cleaning apparatus 31A includes, for example, a roll sponge type cleaning module to be described later, and primarily cleans a substrate W. The substrate cleaning apparatus 31B also includes a roll sponge type cleaning module, and performs secondary cleaning of a substrate W. The substrate cleaning apparatus 31A and the substrate cleaning apparatus 31B may be the same type or different types of cleaning modules, for example, a pencil sponge type cleaning module or a two-fluid jet type cleaning module. The substrate drying apparatus 32 includes a drying module configured to perform, for example, Rotagoni drying (isopropyl alcohol (IPA) drying). After drying, a shutter 1a provided on a partition wall between the substrate drying apparatus 32 and the loading/unloading unit 10 is opened, and a substrate W is taken out from the substrate drying apparatus 32 by the transport robot 12.

The substrate transport unit 40 includes a lifter 41, a first linear transporter 42, a second linear transporter 43, and a swing transporter 44. In the substrate transport path 3, a first transport position TP1, a second transport position TP2, a third transport position TP3, a fourth transport position TP4, a fifth transport position TP5, a sixth transport position TP6, and a seventh transport position TP7 are sequentially set from the loading/unloading unit 10 side.

The lifter 41 is a mechanism configured to transport a substrate W up and down at the first transport position TP1. The lifter 41 receives a substrate W from the transport robot 12 of the loading/unloading unit 10 at the first transport position TP1. In addition, the lifter 41 delivers the substrate W received from the transport robot 12 to the first linear transporter 42. The partition between the first transport position TP1 and the loading/unloading unit 10 is provided with a shutter 1b. When a substrate W is transported, the shutter 1b is opened and the substrate W is delivered from the transfer robot 12 to the lifter 41.

The first linear transporter 42 is a mechanism configured to transport a substrate W among the first transport position TP1, the second transport position TP2, the third transport position TP3, and the fourth transport position TP4. The first linear transporter 42 includes a plurality of transport hands 45 (45A, 45B, 45C, 45D) and a linear guide mechanism 46 that moves each transport hand 45 in a horizontal direction at a plurality of heights. The transport hand 45A is moved between the first transport position TP1 and the fourth transport position TP4 by the linear guide mechanism 46. The transport hand 45A is a pass hand configured to receive a substrate W from the lifter 41 and deliver the substrate W to the second linear transporter 43.

The transport hand 45B is moved between the first transport position TP1 and the second transport position TP2 by the linear guide mechanism 46. The transport hand 45B receives a substrate W from the lifter 41 at the first transport position TP1, and delivers the substrate W to the substrate polishing apparatus 21A at the second transport position TP2. The transport hand 45B is provided with a lift drive unit, which is raised when a substrate W is delivered to the top ring 24 of the substrate polishing apparatus 21A and is lowered after the substrate W is delivered to the top ring 24. In addition, each of the transport hand 45C and the transport hand 45D is provided with the same lift drive unit.

The transport hand 45C is moved between the first transport position TP1 and the third transport position TP3 by the linear guide mechanism 46. The transport hand 45C receives a substrate W from the lifter 41 at the first transport position TP1, and delivers the substrate W to the substrate polishing apparatus 21B at the third transport position TP3. In addition, the transport hand 45C also serves as an access hand that receives a substrate W from the top ring 24 of the substrate polishing apparatus 21A at the second transport position TP2, and delivers the substrate W to the substrate polishing apparatus 21B at the third transport position TP3.

The transport hand 45D is moved between the second transport position TP2 and the fourth transport position TP4 by the linear guide mechanism 46. The transport hand 45D also serves as an access hand for receiving a substrate W from the top ring 24 of the substrate polishing apparatus 21A or the substrate polishing apparatus 21B at the second transport position TP2 or the third transport position TP3, and delivering the substrate W to the swing transporter 44 at the fourth transport position TP4.

The swing transporter 44 has a hand that is movable between the fourth transport position TP4 and the fifth transport position TP5, and delivers a substrate W from the first linear transporter 42 to the second linear transporter 43. In addition, the swing transporter 44 delivers a substrate W polished in the polishing unit 20 to the cleaning unit 30. A temporary wafer W placement table 47 is provided on a lateral side of the swing transporter 44. The swing transporter 44 turns a substrate W received at the fourth transport position TP4 or the fifth transport position TP5 upside down, and places the substrate W on the temporary placement table 47. The substrate W placed on the temporary placement table 47 is transported to the first transport chamber 33 by the transport robot 35 of the cleaning unit 30.

The second linear transporter 43 is a mechanism configured to transport a substrate W among the fifth transport position TP5, the sixth transport position TP6, and the seventh transport position TP7. The second linear transporter 43 includes a plurality of transport hands 48 (48A, 48B, 48C) and a linear guide mechanism 49 configured to move each transport hand 45 horizontally at a plurality of heights. The transport hand 48A is moved between the fifth transport position TP5 and the sixth transport position TP6 by the linear guide mechanism 49. The transport hand 45A functions as an access hand for receiving a substrate W from the swing transporter 44 and delivering the substrate W to the substrate polishing apparatus 21C.

The transport hand 48B moves between the sixth transport position TP6 and the seventh transport position TP7. The transport hand 48B functions as an access hand for receiving a substrate W from the substrate polishing apparatus 21C and delivering the substrate to the substrate polishing apparatus 21D. The transport hand 48C moves between the seventh transport position TP7 and the fifth transport position TP5. The transport hand 48C also serves as an access hand for receiving a substrate W from the top ring 24 of the substrate polishing apparatus 21C or the substrate polishing apparatus 21D at the sixth transport position TP6 or the seventh transport position TP7, and delivering the substrate W to the swing transporter 44 at the fifth transport position TP5. Although not described, the operation of the transport hand 48 when transporting a substrate W is the same as the operation of the first linear transporter 42 described above.

Figure 2:
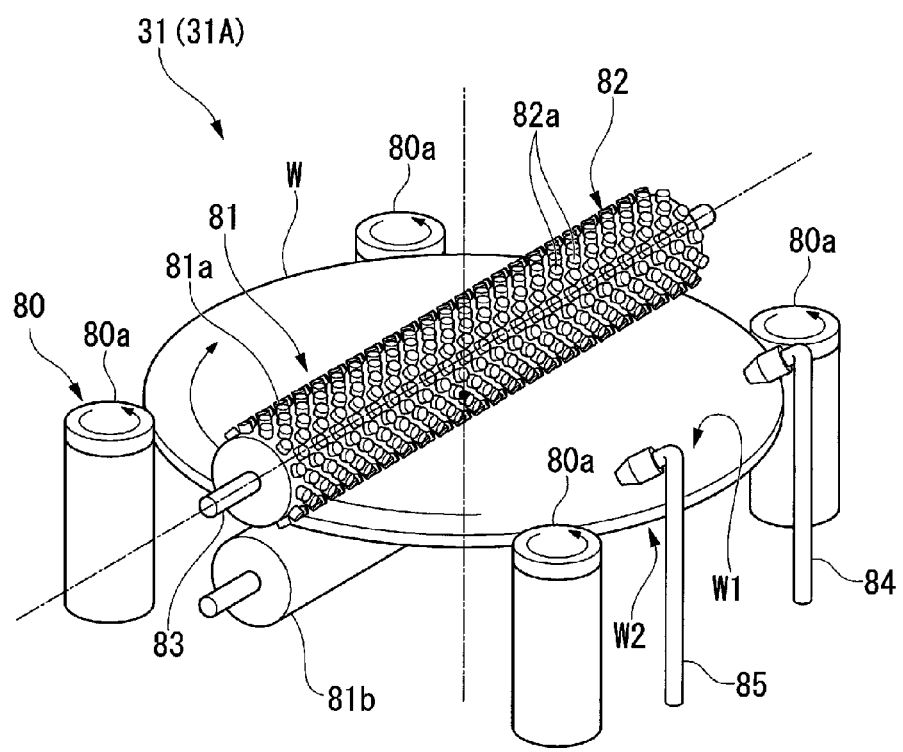
FIG. 2 is a perspective view illustrating the configuration of a substrate cleaning apparatus according to the first embodiment.

FIG. 2 is a perspective view illustrating the configuration of a substrate cleaning apparatus 31 according to the first embodiment.

The substrate cleaning apparatus 31 includes a rotation mechanism 80 configured to rotate a substrate W, and roll cleaning members 81 (cleaning members) configured to scrub-clean the substrate W by coming into contact with the substrate W while rotating. The rotation mechanism 80 includes a plurality of holding rollers 80a configured to hold the outer periphery of a substrate W and rotate around an axis extending in the vertical direction. The plurality of holding rollers 80a are connected to an electric drive unit such as, for example, a motor, and rotate horizontally. The plurality of holding rollers 80a are configured to be movable up and down by an air drive unit such as, for example, an air cylinder.

The roll cleaning members 81 include an upper roll cleaning member 81a configured to come int contact with the upper surface W1 (polished surface) of a substrate W and a lower roll cleaning member 81b configured to contact with the lower surface W2 of the substrate W. The upper roll cleaning member 81a and the lower roll cleaning member 81b is rotated by being connected to an electric drive unit such as, for example, a motor. In addition, the upper roll cleaning member 81a is configured to be supported by an arm 90 (see, e.g., FIG. 3) (to be described later) to be movable up and down. The lower roll cleaning member 81b is held at a predetermined height.

When setting a substrate W, first, the upper roll cleaning member 81a and the plurality of holding rollers 80a are raised. Next, the substrate W is held in a horizontal orientation by the raised plurality of holding rollers 80a, and then lowered until the lower surface W2 of the substrate W is brought into contact with the lower roll cleaning member 81b. Finally, the upper roll cleaning member 81a is lowered and brought into contact with the upper surface W1 of the substrate W.

The roll cleaning member 81 has a substantially cylindrical roll sponge 82 and a rotation shaft 83 configured to support the roll sponge 82 in the horizontal direction. As the material of the roll sponge 82, for example, polyvinyl alcohol (PVA) sponge or urethane foam may be used. On the peripheral surface of the roll sponge 82, a plurality of protrusions 82a are formed. The plurality of protrusions 82a are arranged at a predetermined pitch in the longitudinal direction of the peripheral surface of the roll sponge 82, and the rows of protrusions 82a adjacent in the peripheral direction of the roll sponge 82 are shifted by a half pitch. That is, the plurality of protrusions 82a are provided in a staggered arrangement on the peripheral surface of the roll sponge 82. In addition, although the protrusions 82a of the present embodiment have a column shape, the protrusions 82a may have, for example, a square column shape or other polygonal column shapes.

The substrate cleaning apparatus 31 is provided with two cleaning liquid supply nozzles 84 and 85 that are positioned above a rotating substrate W supported by the holding rollers 80a and supply the cleaning liquid to the upper surface W1 of the substrate W. From the cleaning liquid supply nozzles 84 and 85, for example, a chemical liquid such as, for example, SC1 (ammonia/hydrogen peroxide mixed aqueous solution) and/or pure water is sprayed toward the upper surface W1 of the substrate W. Although not illustrated, two cleaning liquid supply nozzles configured to supply the cleaning liquid are also provided on the lower surface W2 of the substrate W. The substrate cleaning apparatus 31A scrub-cleans the entire upper surface W1 and lower surface W2 of the substrate by supplying the cleaning liquid from the cleaning liquid supply nozzles 84 and 85 to the upper surface W1 of the substrate W while supplying the cleaning liquid from the two cleaning liquid supply nozzles (not illustrated) to the lower surface W2 of the substrate W, and by rotating the pair of roll cleaning members 81 in reverse directions while revolving the substrate W by the holding rollers 80a.

Figure 3:
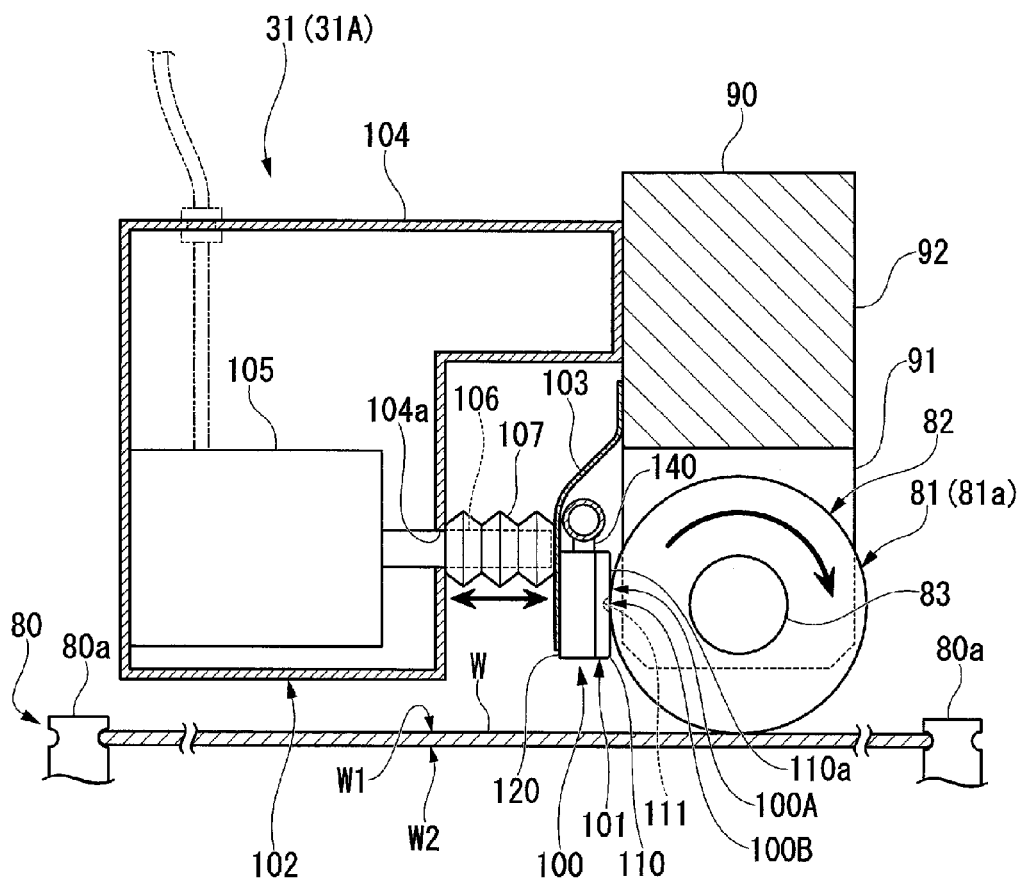
FIG. 3 is a side view illustrating the configuration of a self-cleaning apparatus of a roll cleaning member provided in the substrate cleaning apparatus according to the first embodiment.

FIG. 3 is a side view illustrating the configuration of a self-cleaning apparatus 100 of a roll cleaning member 81 provided in the substrate cleaning apparatus 31 according to the first embodiment.

The substrate cleaning apparatus 31 includes the self-cleaning apparatus 100 that self-cleans the roll cleaning member 81. The self-cleaning apparatus 100 illustrated in FIG. 3 is attached to an arm 90 that moves the upper roll cleaning member 81a.

The arm 90 includes a pair of support portions 91 configured to pivotally support opposite ends of the rotation shaft 83 of the roll cleaning member 81, and a long arm body 92 configured to hold the pair of support portions 91 at opposite ends thereof in the longitudinal direction. A bearing (not illustrated) that supports the roll cleaning member 81 and an electric drive unit such as, for example, a motor (not shown) that rotates the roll cleaning member 81, are accommodated inside the support portions 91 or the arm body 92. The arm body 92 is configured to be movable up and down by an air drive unit such as, for example, an air cylinder.

The self-cleaning apparatus 100 includes a contact suction member 101 configured to come into contact with the roll cleaning member 81 so as to perform suction, and an actuator 102 (a movement apparatus) configured to move the contact suction member 101 close to and away from the roll cleaning member 81. The operation of the actuator 102 is controlled by the controller 50 illustrated in FIG. 1. Under the control of the controller 50, the actuator 102 relatively move the roll cleaning member 81 and the contact suction member 101 between a contact position (the position illustrated in FIG. 3) at which the roll cleaning member 81 and the contact suction member 101 are in contact with each other and a separation position (to be described later) at which the roll cleaning member 81 and the contact suction member 101 are separated from each other.

The contact suction member 101 is attached to a side wall surface of the arm body 92 via a leaf spring 103. The leaf spring 103 is elastically deformed in the state illustrated in FIG. 3 and biases the contact suction member 101 in a direction away from the roll cleaning member 81. The actuator 102 presses the contact suction member 101 against the peripheral surface (the roll sponge 82) of the roll cleaning member 81 against the biasing of the leaf spring 103. For this reason, when the pressing of the actuator 102 is released, the leaf spring 103 is restored and deformed, and the contact suction member 101 is separated from the roll cleaning member 81. This position is the aforementioned separation position.

The actuator 102 includes a housing 104 fixed to the side wall surface of the arm body 92, an actuator body 105 accommodated in the housing 104, and a shaft 106 moved back and forth by the actuator body 105. The housing 104 has a through hole 104a through which the shaft 106 is inserted. The actuator body 105 includes an air drive unit such as, for example, an air cylinder, and moves back and forth the shaft 106 disposed in the through hole 104a. The tip end of the shaft 106 is enabled to abut on the leaf spring 103, and is also enabled to be brought into a non-abutment state with respect to the leaf spring 103.

The shaft 106 is covered with an extendable waterproof cover 107 from the through hole 104a to the tip end of the shaft 106. The waterproof cover 107 is formed in a bellows shape. One end of the waterproof cover 107 is fixed to the tip end of the shaft 106 via a fixing member (not illustrated), and the other end of the waterproof cover 107 is fixed to the housing 104 so as to cover the through hole 104a. The waterproof cover 107 prevents the cleaning liquid from being infiltrated into the housing 104 through the through hole 104a.

Figure 4:
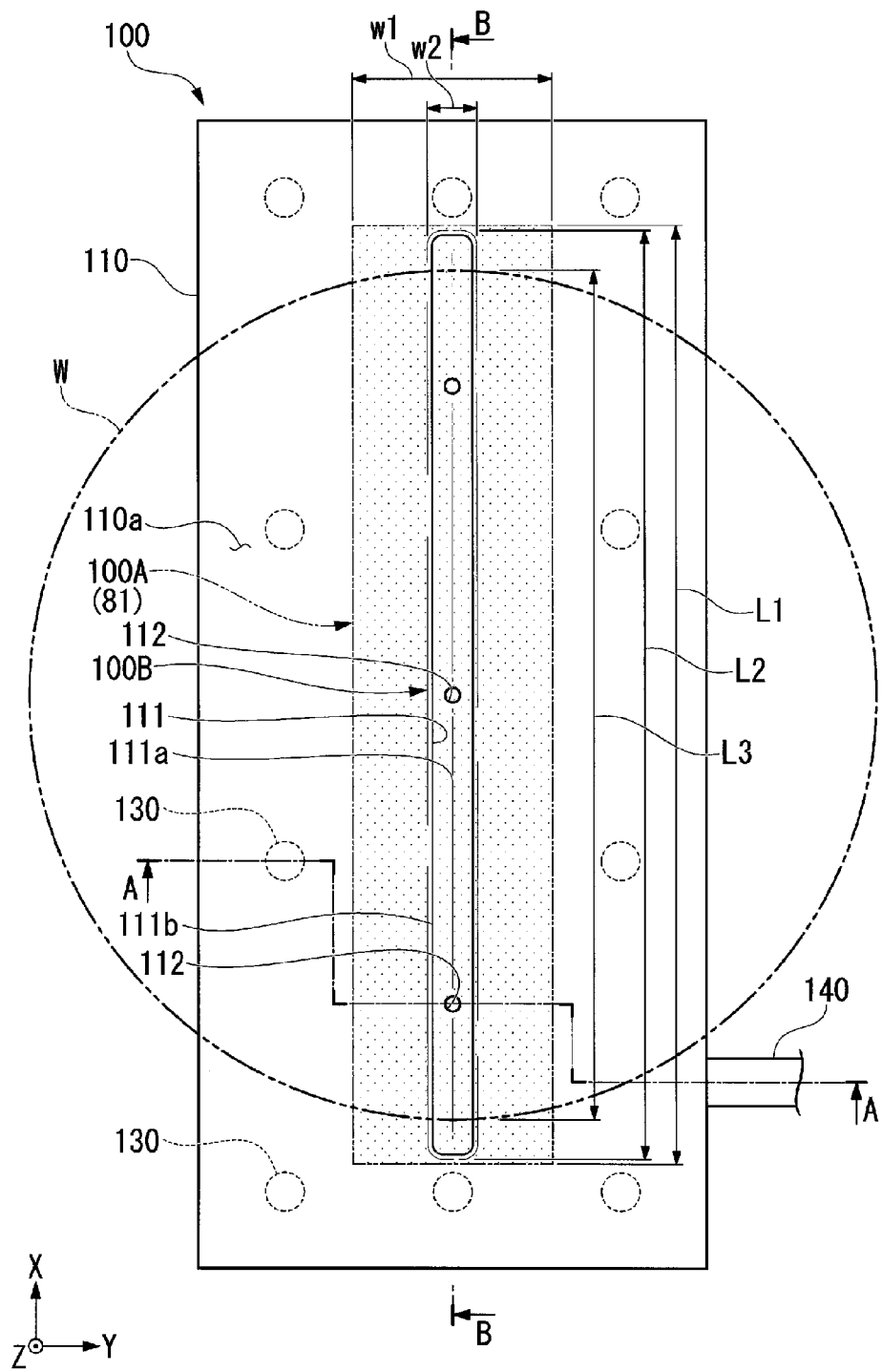
FIG. 4 is a plan view illustrating the configuration of a contact suction member according to the first embodiment.
Figure 5:
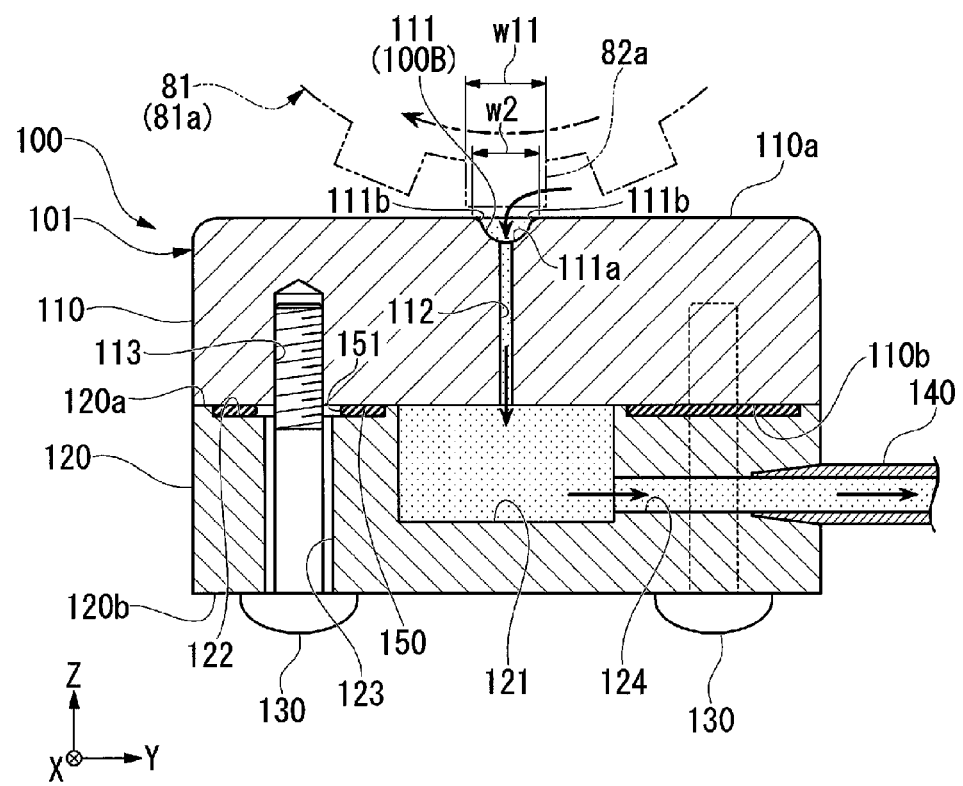
FIG. 5 is a cross-sectional view taken along line A-A of the contact suction member illustrated in FIG. 4.
Figure 6:
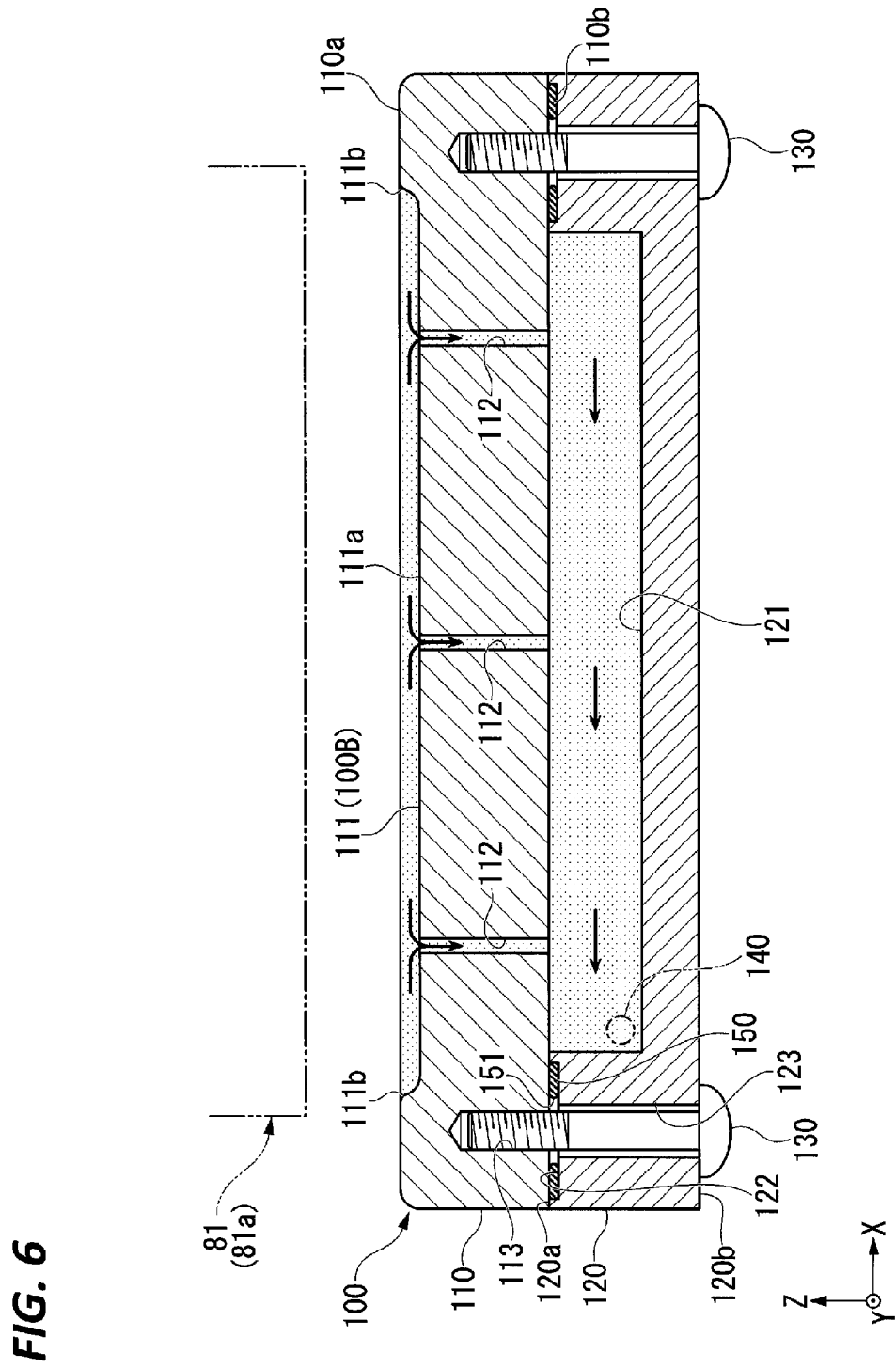
FIG. 6 is a cross-sectional view taken along line B-B of the contact suction member illustrated in FIG. 4.

FIG. 4 is a plan view illustrating the configuration of the contact suction member 101 according to the first embodiment. FIG. 5 is a cross-sectional view taken along line A-A of the contact suction member 101 illustrated in FIG. 4. FIG. 6 is a cross-sectional view taken along line B-B of the contact suction member 101 illustrated in FIG. 4.

In FIG. 4, a facing surface 110a of the contact suction member 101 facing the roll cleaning member 81 is illustrated in a plan view. The contact suction member 101 is formed in a substantially rectangular shape extending in the rotation axis direction of the roll cleaning member 81 in a plan view.

In the following description, an XYZ orthogonal coordinate system may be set, and the positional relationship of each member may be described with reference to this XYZ orthogonal coordinate system. The X-axis direction is the rotation axis direction of the roll cleaning member 81. The Y-axis direction is an orthogonal-to-rotation-axis direction orthogonal to the rotation axis direction along the facing surface 110a. The Z-axis direction is a second orthogonal-to-rotation-axis direction orthogonal to the rotation axis direction and perpendicular to the facing surface 110a. That is, the Z-axis direction is also a pressing direction of the facing surface 110a against the roll cleaning member 81.

As illustrated in FIG. 5, the contact suction member 101 includes a cleaning plate 110 forming the facing surface 110a, a fixing plate 120 disposed on the non-facing surface 110b side of the cleaning plate 110, a plurality of bolts 130 fixing the fixing plate 120 to the cleaning plate 110, and a suction pipe 140 connected to the fixing plate 120. The cleaning plate 110 is formed of, for example, quartz glass, and the facing surface 110a has the same flatness as the upper surface W1 (polished surface) of the substrate W. The fixing plate 120 is formed of a resin material having both chemical resistance and physical strength, such as, for example, polyester ether ketone (PEEK).

As illustrated in FIG. 4, the facing surface 110a of the cleaning plate 110 has a slit groove 111 extending in the rotation axis direction (X-axis direction) in the center in the orthogonal-to-rotation axis direction (Y-axis direction), and a plurality of suction holes 112 arranged in the bottom surface 111a of the slit groove 111 at intervals in the rotation axis direction. The slit groove 111 is formed in a rectangle shape with four rounded corners in a plan view. A total of three suction holes 112 are provided, in which one suction hole is provide in the central portion of the slit groove 111 in the longitudinal direction (rotation axis direction) and one hole is provided on each side in the longitudinal direction of the central portion and at a predetermined distance from each of the opposite longitudinal ends of the slit groove 111 toward the central portion.

As illustrated in FIG. 5, the bottom surface 111a of the slit groove 111 is formed in a circular arc shape in which the opening positions of the suction holes 112 are deepest in the transversal cross-sectional view across the slit groove 111. In addition, the opening edge 111b of the slit groove 111 is formed in a circular arc shape in which the inclination gradually increases toward the bottom surface 111a of the slit groove 111 in the transversal cross-sectional view across the slit groove 111. Specifically, the inclination angle of the opening edge 111b with respect to the facing surface 110a is an angle close to zero in the vicinity of the facing surface 110a, but the inclination angle gradually increases as the distance from the facing surface 110a increases. That is, the space between the slit groove 111 and the facing surface 110a (opening edge 111b) is rounded and has no corner (protrusion). In addition, the slit groove 111 has a smooth continuous surface (substantially S-shaped curved surface) from the opening edge 111b to the bottom surface 111a.

As illustrated in FIG. 6, the opening edge 111b of the slit groove 111 is also formed in a circular arc shape in which the inclination gradually increases toward the bottom surface 111a of the slit groove 111 even in the longitudinal cross-sectional view through the slit groove 111. That is, the opening edge 111b of the slit groove 111 has a shape with no corner over the entire periphery thereof. Such an opening edge 111b is formed by, for example, forming a substantially semi-cylindrical slit groove 111 (having corners on the opening edge 111b) on the facing surface 110a by machining, and then putting the cleaning plate 110 into, for example, a heating furnace so as to heat treatment (melting treatment) such that the corners of the opening edge 111b are rounded.

The suction holes 112 penetrates from the bottom surface 111a of the slit groove 111 to the non-facing surface 110b of the cleaning plate 110 in the Z-axis direction. Screw holes 113 into which bolts 130 are screwed are formed in the non-facing surface 110b of the cleaning plate 110.

The fixing plate 120 has a chamber 121 formed to surround the open ends of the plurality of suction holes 112 that open to the non-facing surface 110b side of the cleaning plate 110. The chamber 121 is formed to have a predetermined depth from the facing surface 120a of the fixing plate 120 facing the cleaning plate 110 toward the non-facing surface 120b.

The chamber 121 is a substantially hollow box-shaped space extending in the rotation axis direction (X-axis direction) in the central portion of the fixing plate 120 in the orthogonal-to-rotation axis direction (Y-axis direction). The chamber 121 has a spatial volume larger than the spatial volume obtained by adding the plurality of suction holes 112 to the slit groove 111. As illustrated in FIG. 5, the fixing plate 120 has a communication hole 124 that allows the chamber 121 and the suction pipe 140 to communicate with each other. The communication hole 124 is formed from a side surface of the chamber 121 to a side surface of the fixing plate 120 and is connected to the suction pipe 140. The suction pipe 140 is connected to a negative pressure generator (not illustrated) (which may be, e.g., a vacuum pump provided exclusively for the apparatus or may be, for example, a factory vacuum line). In addition, a gas-liquid separation apparatus, which separates a cleaning liquid (and contaminants) from intake air, may be arranged upstream of the negative pressure generator.

A recess 122 having a rectangular frame shape in a plan view is formed around the chamber 121 in the facing surface 120a of the fixing plate 120. A seal member 150 that seals the gap between the cleaning plate 110 and the fixing plate 120 is disposed in the recess 122. The seal member 150 is a sheet-shaped gasket formed in the rectangular frame shape in a plan view. The fixing plate 120 has the insertion holes 123 through which the bolts 130 are inserted so as to face the screw holes 113, respectively. The insertion holes 123 are formed at positions passing through the recess 122. For this reason, the seal member 150 has through holes 151 through which the bolts 130 are capable of being inserted in the Z-axis direction, respectively.

Returning to FIG. 4, the facing surface 100a of the contact suction member 101 configured as described above includes a contact area 100A configured to be capable of coming into contact with the roll cleaning member 81 and a suction area 100B configured to suction contaminants and cleaning liquid from the roll cleaning member 81. The contact area 100A is an area with which a portion of the peripheral surface (roll sponge 82) of the roll cleaning member 81 is capable of coming into contact by being deformed in a flat form along the facing surface 110a when the contact suction member 101 is pressed. The suction area 100B is an area in a negative pressure is generated in the slit groove 111 through the chamber 121 and the plurality of suction holes 112 due to suction from the suction pipe 140. That is, the suction area 100B is included up to the opening edge 111b having the circular arc shape of the slit groove 111 in the cross section.

As illustrated in FIG. 4, the suction area 100B is included in the contact area 100A. That is, the suction area 100B is located in the contact area 100A. Alternatively, the suction area 100B is surrounded by the contact area 100A.

Specifically, the length of the slit groove 111 that forms the suction area 100B is shorter than the roll cleaning member 81 that forms the contact area 100A in the rotation axis direction (X-axis direction). More specifically, the length of the slit groove 111 is shorter than that of the roll sponge 82 (elastically deformable peripheral surface portion) of the roll cleaning member 81 in the rotation axis direction. That is, in the rotation axis direction, when the length dimension of the roll sponge 82 is L1 and the length dimension of the slit groove 111 is L2, there is a relationship of L2<L1. In addition, the length of the slit groove 111 is longer than that of the substrate W in the rotation axis direction. That is, the length of the slit groove 111 is longer than the diameter of the substrate W in the rotation axis direction. Therefore, when the dimension of the diameter of the substrate W is L3, there is a relationship of L3<L2<L1. When the dimension of L3 is 30 cm, for example, the dimension of L1 is about 31 cm to 32 cm, and the dimension of L2 may be a dimension between L1 and L3.

In addition, the width of the slit groove 111 that forms the suction area 100B is smaller than the contact width of the roll cleaning member 81 that forms the contact area 100A in the orthogonal-to-rotation axis direction (Y-axis direction). That is, in the orthogonal-to-rotation axis direction, when the dimension of the contact width of the roll sponge 82 of the roll cleaning member 81 is w1, and the dimension of the width of the slit groove 111 is w2, there is a relationship of w2<w1. Further, as illustrated in FIG. 5, the width of the slit groove 111 is smaller than the width of the protrusions 82a formed on the peripheral surface of the roll cleaning member 81 in the orthogonal-to-rotation axis direction. More specifically, the width of the slit groove 111 is smaller than the diameter of the protrusions 82a in the orthogonal-to-rotation axis direction. Therefore, when the dimension of the diameter of the protrusions 82a is w11, there is a relationship of w2<w11<w1. When the dimension of w11 is about 6 mm to 8 mm, the dimension of w2 is 5 mm and the dimension of w1 is about 10 mm to 40 mm.

The above-described dimensions are merely examples, and may be appropriately changed depending on the specifications of the apparatus.

Subsequently, the operation of the self-cleaning apparatus 100 configured as described above (the cleaning member self-cleaning method) will be described.

As illustrated in FIG. 3, the self-cleaning apparatus 100 of the present embodiment self-cleans the roll cleaning member 81 while the roll cleaning member 81 is scrub-cleaning the substrate W. The timing for pressing the contact suction member 101 against the peripheral surface of the roll cleaning member 81 may be during scrub cleaning of the substrate W or before scrub cleaning.

When the contact suction member 101 is pressed against the peripheral surface of the roll cleaning member 81, a portion of the peripheral surface of the roll cleaning member 81 is elastically deformed into the same flat shape as the facing surface 110a. Due to this elastic deformation, the contaminants attached and deposited on the peripheral surface of the roll cleaning member 81 are squeezed out together with the cleaning liquid. The squeezed contaminants are removed by suction in the suction area 100B formed on the same facing surface 110a as the contact area 100A. As illustrated in FIG. 4, since the suction area 100B is included in the contact area 100A, the suction area 100B is covered with the roll cleaning member 81, and the ambient air (outside air) is not suctioned. Therefore, it is possible to efficiently suction and remove the squeezed contaminants together with the cleaning liquid. As a result, it is possible to eliminate the concern that the squeezed contaminants are reattached to a substrate W or the roll cleaning member 81.

In the present embodiment, the contact area 100A is formed by a flat surface as illustrated in FIG. 4. According to this configuration, since it is possible to secure a wide contact area with the roll cleaning member 81, the seal area around the suction area 100B is increased, which makes it difficult to suction ambient air in the suction area 100B. In addition, since the contact area with the roll cleaning member 81 is increased, a local load is not applied to the roll cleaning member 81, and it is possible to suppress the roll cleaning member 81 from being damaged and worn due to self-cleaning.

In the present embodiment, a slit groove 111 extending along the rotation axis direction of the roll cleaning member 81 and a plurality of suction holes arranged at intervals in the rotation axis direction on the bottom surface 111a of the slit groove 111 are formed in the suction area 100B. For example, in the case where the slit groove 111 is a full opening (a slit hole without the bottom surface 111a), even if the roll cleaning member 81 is slightly displaced in the rotation axis direction, there is a risk that only the ambient air is suctioned from the ends of the slit hole. However, since the slit groove 111 of the present embodiment has a bottom surface 111a and the suction location is partial (the plurality of suction holes 112), even if the roll cleaning member 81 is slightly displaced in the rotation axis direction, it is possible to maintain the negative pressure generated in the suction area 100B, and to suppress reduction in efficiency of removal by suction.

In the present embodiment, the length of the slit groove 111 is shorter than that of the roll cleaning member 81 in the rotation axis direction. With this configuration, it is possible to reliably suppress the suction of ambient air at opposite ends of the slit groove 111 in the longitudinal direction.

In the present embodiment, the length of the slit groove 111 is longer than that of the substrate W in the rotation axis direction. The length (area) of the substrate W in the rotation axis direction is an area in which contaminants are attached and deposited to the roll cleaning member 81 that cleans the substrate W. Therefore, by setting the length of the slit groove 111 to cover this area, it is possible to efficiently remove the contaminants from the roll cleaning member 81 by suction.

In the present embodiment, a plurality of protrusions 82a are formed on the peripheral surface of the roll cleaning member 81, and as illustrated in FIG. 5, the width of the slit groove 111 is smaller than the width of the protrusions 82a in the orthogonal-to-rotation axis direction orthogonal to the rotation direction. With this configuration, since the protrusions 82a of the roll cleaning member 81 is difficult to enter the slit groove 111, it is possible to prevent the protrusions from being damaged (e.g., sheared).

In the present embodiment, the opening edge 111b of the slit groove 111 is formed in a circular arc shape in which the inclination gradually increases toward the bottom surface 111a of the slit groove 111 in each of a transversal cross-sectional view across the slit groove 111 as illustrated in FIG. 4 and a longitudinal cross-sectional view through the slit groove 111 as illustrated in FIG. 5. With this configuration, since the opening edge 111b of the slit groove 111 is rounded and has no corner, it is possible to suppress the damage of the peripheral surface or the protrusions 82a of the roll cleaning member 81, which are in sliding contact with the opening edge 111b.

In the present embodiment, as illustrated in FIG. 3, the self-cleaning apparatus 100 includes a contact suction member 101 having a contact area 100A and a suction area 100B, an actuator 102 configured to relatively move the roll cleaning member 81 and the contact suction member 101 between a contact position where the roll cleaning member 81 and the contact suction member 101 are in contact with each other and a separation position where the roll cleaning member 81 and the contact suction member 101 are separated from each other, and a controller 50 configured to control the actuator 102. With this configuration, it is possible to perform the self-cleaning of the roll cleaning member 81 at an arbitrary timing. Therefore, it is possible to freely set the self-cleaning timing and time of the roll cleaning member 81 during a substrate processing step. In addition, it is possible to obtain a high self-cleaning effect while suppressing the wear of the roll cleaning member 81, and to increase the life of the roll cleaning member 81.

In the present embodiment, the controller 50 controls the actuator 102 such that the roll cleaning member 81 and the contact suction member 101 come into contact with each other at least while the roll cleaning member 81 scrub-cleans the substrate W. In this way, during the scrub-cleaning of the substrate W, the contact suction member 101 is brought into contact with the roll cleaning member 81, and the self-cleaning of the roll cleaning member 81 is performed. As a result, it is possible to suppress accumulation of contaminants in the roll cleaning member 81. Therefore, it is possible to maintain the roll cleaning member 81 clean, to obtain a high substrate cleaning effect, and to increase the life of the roll cleaning member 81.

Thus, according to the present embodiment described above, it is possible to obtain a substrate cleaning apparatus 31 including a roll cleaning member 81 configured to scrub-clean a substrate W and a self-cleaning apparatus 100 configured self-clean the roll cleaning member 81, in which the self-cleaning apparatus 100 adopts a configuration having a contact area 100A capable of come into contact with the roll cleaning member 81 and a suction area 100B included in the contact area 100A. As a result, it is possible to efficiently suction and remove the contaminants attached to the roll cleaning member 81. In addition, with the substrate processing apparatus 1 including the substrate cleaning apparatus 31 in the cleaning unit 30, it is possible to suppress the deterioration of the cleaning performance in the cleaning unit 30, thereby making it possible to reduce the maintenance frequency and to improve a substrate processing throughput.

Second Embodiment

Next, a second embodiment of the present disclosure will be described. In the following description, components, which are the same as or equivalent to those in the above-described embodiment, are denoted by the same reference numerals, and descriptions thereof will be simplified or omitted.

Figure 7:
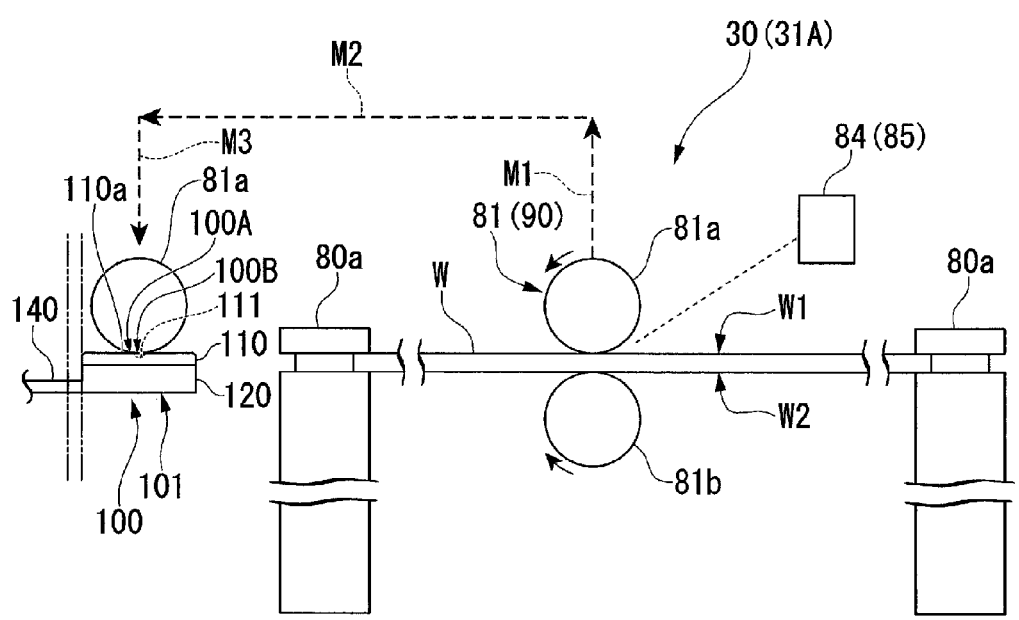
FIG. 7 is a side view illustrating the configuration of a substrate cleaning apparatus according to a second embodiment.

FIG. 7 is a side view illustrating the configuration of a substrate cleaning apparatus 31 according to the second embodiment.

As illustrated in FIG. 7, the second embodiment is different from the above-described embodiment in that the self-cleaning apparatus 100 is installed at the roll cleaning member 81 standby position which is separated from the substrate W cleaning position.

The roll cleaning member 81 (the upper roll cleaning member 81a) is supported by the above-described arm 90, the arm 90 is movable up and down and is movable horizontally as indicated by reference numeral M2 by, for example, a linear slider (not illustrated). Specifically, the upper roll cleaning member 81a is first raised from the cleaning position by the arm 90 as indicated by reference numeral M1, and then horizontally moved from directly above the cleaning position to immediately above the standby position as indicated by reference numeral M2. Finally, as indicated by reference numeral M3, the upper roll cleaning member 81a may be lowered to the self-cleaning apparatus 100 from directly above the standby position. The operation of the arm 90 (movement apparatus) that realizes the movement of the upper roll cleaning member 81a may be controlled by the controller 50 illustrated in FIG. 1.

In this standby position, the contact suction member 101 is installed in the state in which the facing surface 110a faces upward. For example, a chemical liquid pipe and a pure water pipe (not illustrated) are arranged on the facing surface 110a. The chemical liquid ejected from a chemical liquid pipe may be the same as the chemical liquid used for cleaning a substrate W in the substrate cleaning apparatus 31. In the cleaning of the upper roll cleaning member 81a at this standby position, the contaminants attached to the roll cleaning member 81a are squeezed out by pressing the upper roll cleaning member 81a against the facing surface 110a of the contact suction member 101 while rotating the upper roll cleaning member 81a and spraying the chemical liquid toward the upper roll cleaning member 81a. Then, the squeezed contaminants are suctioned and removed in the suction area 100B housed in the contact area 100A. According to the second embodiment, as in the first embodiment described above, it is possible to efficiently suction and remove the squeezed contaminants together with the cleaning liquid without suctioning ambient air (outside air) in the suction area 100B.

In the second embodiment, the bottom surface 111a of the slit groove 111 is formed in a circular arc shape in which the opening positions of the suction holes 112 is deepest in the transversal cross-sectional view across the slit groove 111. With this configuration, it is possible to store the cleaning liquid at the bottom of the bottom surface 111a of the slit groove 111, and to preferentially suction and remove the cleaning liquid. In other words, the suction holes 112 is covered with the cleaning liquid accumulated at the bottom of the bottom surface 111a of the slit groove 111, and suction the cleaning liquid in preference to the ambient air, thereby suppressing the suction of the ambient air.

In addition, in the second embodiment, the controller 50 controls the arm 90 such the upper roll cleaning member 81a and the contact suction member 101 are in contact with each other at least while the roll cleaning member 81 is positioned at the standby position where a substrate W is not scrub-cleaned. As described above, when the scrub-cleaning of the substrate W is not being performed, the upper roll cleaning member 81a is brought into contact with the contact suction member 101 at the standby position separated from the substrate W cleaning position so as to perform self-cleaning. As a result, it is possible to reliably prevent the contaminants squeezed out from the upper roll cleaning member 81a from being reattached to the substrate W.

Third Embodiment

Next, a third embodiment of the present disclosure will be described. In the following description, components, which are the same as or equivalent to those in the above-described embodiments, are denoted by the same reference numerals, and descriptions thereof will be simplified or omitted.

Figure 8:
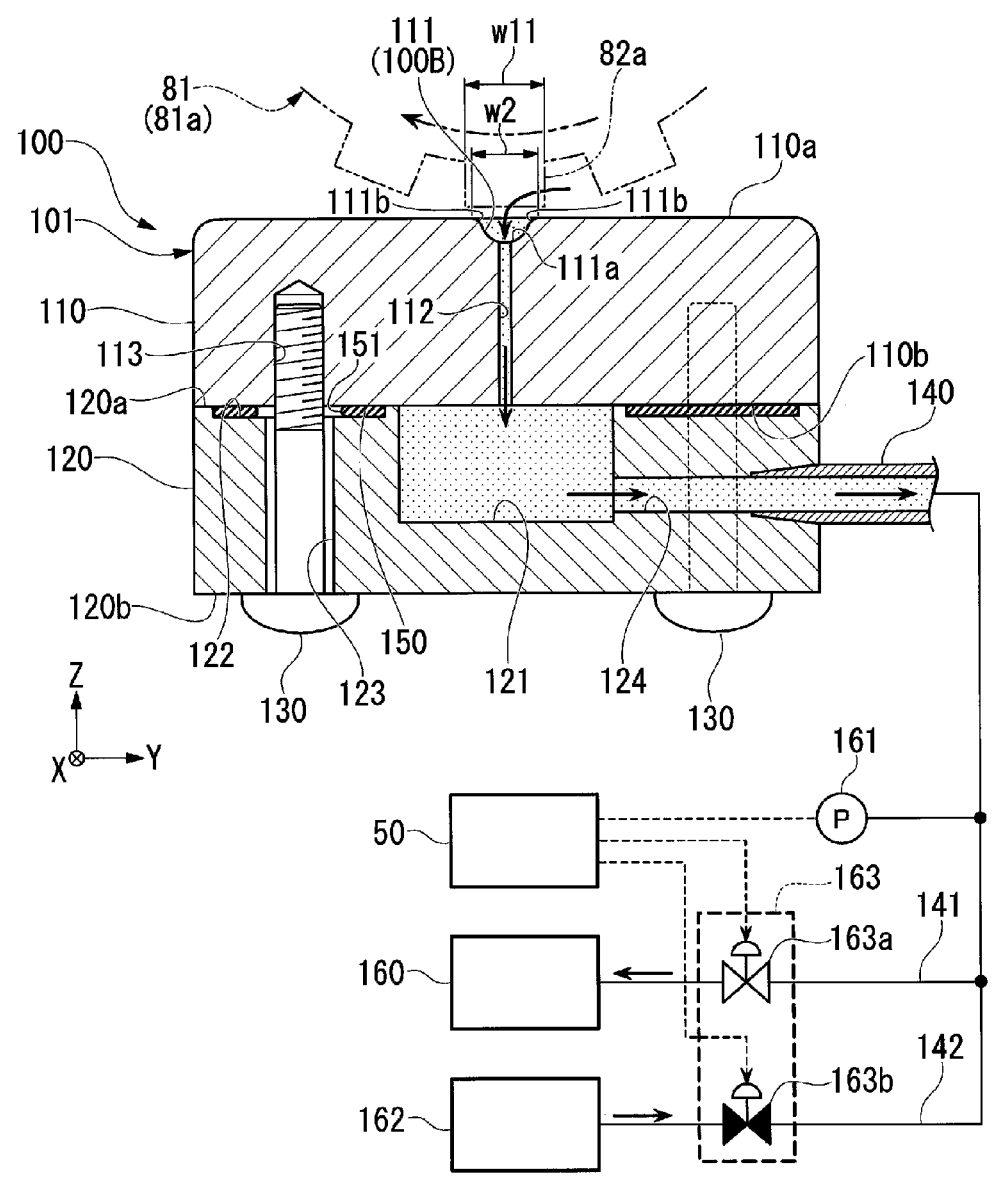
FIG. 8 is a view illustrating the configuration of a self-cleaning apparatus according to a third embodiment.

FIG. 8 is a view illustrating the configuration of a substrate cleaning apparatus 100 according to the third embodiment.

As illustrated in FIG. 8, the third embodiment is different from the above-described embodiments in that the self-cleaning apparatus 100 includes a pressure sensor 161 (a measurement device), a positive pressure generator 162, and a switching device 163 in addition to the above-described negative pressure generator 160 (not illustrated in the above-described embodiment) connected to the suction pipe 140.

The negative pressure generator 160 is connected to the suction pipe 140 as described above, and is capable of suctioning the fluid (including air and cleaning liquid) of the chamber 121, the plurality of suction holes 112, and the slit groove through the suction pipe 140. Thus, a negative pressure is generated in the suction area 100B.

The pressure sensor 161 measures this negative pressure, and is installed in the suction pipe 140. The pressure sensor 161 may be installed in the chamber 121 as long as the negative pressure can be measured.

The suction pipe 140 of the third embodiment is branched into a first pipe 141 and a second pipe 142 on the upstream side from the negative pressure generator 160. The negative pressure generator 160 is connected to the first pipe 141. The positive pressure generator 162 is connected to the second pipe 142.

The positive pressure generator 162 feeds fluid (either air or liquid) into the suction pipe 140, and ejects (flushes) the fluid from the plurality of suction holes 112. The positive pressure generator 162 may be, for example, a pump that pumps fluid.

The switching device 163 includes a first control valve 163a that opens/closes the first pipe 141, and a second control valve 163b that opens/closes the second pipe 142. The operation of the switching device 163 (the opening/closing switching operation of the first control valve 163a and the second control valve 163b) is controlled by the controller 50. The controller 50 operates the switching device 163 based on the measurement result of the pressure sensor 161. The controller 50 closes the first pipe 141 and opens the second pipe 142 when the measurement result of the pressure sensor 161 (the negative pressure in the suction area 100B) is not a normal value.

Here, the wording "the negative pressure is not a normal value" means a case where the negative pressure in the suction area 100B is significantly greatly higher or lower than a predetermined set value. When the negative pressure is significantly higher (when the negative pressure is near vacuum than the set value), for example, there is a possibility that the suction holes 112 are the state in which the suction holes 112 are not capable of suctioning the cleaning liquid is by being completely blocked by foreign matter (choke suction state). In addition, when the negative pressure is extremely low (when the negative pressure is closer to the atmospheric pressure than the set value), for example, there is a possibility that, for example, a large piece is caught in the suction holes 112 and the piece forms a gap between the roll cleaning member 81 and the facing surface 110a, thereby suctioning the ambient air.

Therefore, in an embodiment of the present disclosure, a signal indicating the measurement result obtained by the pressure sensor 161 (i.e., a pressure value indicating a negative pressure) is transmitted to the controller 50. The controller 50 includes therein a processing unit and a storage unit and determines whether or not the pressure value received from the pressure sensor 161 as the measurement result falls within a predetermined set value range read from the storage unit (i.e., a range from an upper limit value to a lower limit value). When it is determined that the received pressure value does not fall within the predetermined set value range, the controller 50 generates an alarm signal indicating that the received pressure value is abnormal, and activates a load lock function equipped in the negative pressure generator 160 to stop the processing of the substrate being processed in the substrate cleaning apparatus. Alternatively, the substrate cleaning processing may be completed first, and the substrate may be then unloaded from the housing, while a next unprocessed substrate may be stopped from being loaded into the substrate cleaning apparatus.

Figure 9:
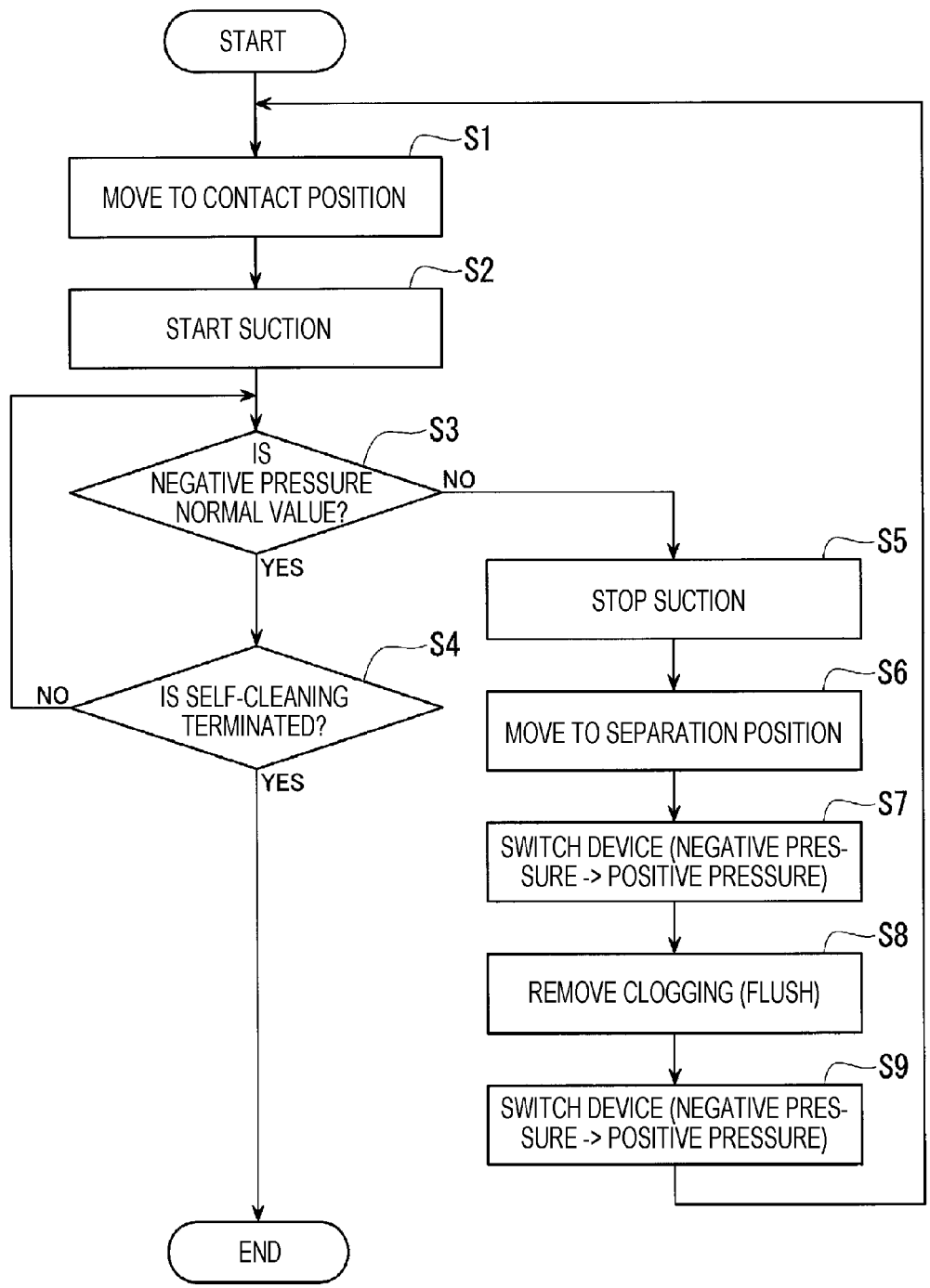
FIG. 9 is a flowchart for explaining the operation of the self-cleaning apparatus (a cleaning member self-cleaning method) according to the third embodiment.

FIG. 9 is a flowchart for explaining the operation of the self-cleaning apparatus 100 (the self-cleaning method of the cleaning member) according to the third embodiment. FIG. 9 illustrates a case in which the self-cleaning apparatus 100 is installed at the roll cleaning member 81 standby position separated from the substrate W cleaning position and performs self-cleaning at the standby position, as in the second embodiment.

First, the controller 50 drives the arm 90 to move the upper roll cleaning member 81a to a contact position where the upper roll cleaning member 81a is brought into contact with the facing surface 110a of the contact suction member 101 (step S1). When the upper roll cleaning member 81a comes into contact with the contact suction member 101 at the contact position, the controller 50 drives the negative pressure generator 160 to start suction through the contact suction member 101 (step S2). At this time, the first control valve 163a illustrated in FIG. 8 is opened, and the second control valve 163b is closed.

Next, the controller 50 determines whether or not the negative pressure in the suction area 100B is a normal value while checking the measurement result of the pressure sensor 161 (step S3). When the negative pressure is a normal value (when step S3 is "YES"), the controller 50 determines whether or not the self-cleaning is terminated (step S4). When the self-cleaning is not terminated (when step S4 is "NO"), the process returns to step S3, and the controller 50 monitors the pressure sensor 161 until the self-cleaning is terminated. When the self-cleaning is terminated (when step S4 is "YES"), the monitoring of the pressure sensor 161 is terminated.

In addition, in an embodiment, the controller 50 may perform a feedback control in which the relative position of the roll cleaning member 81 with respect to the contact suction member 101, the pressing force (pressing amount) of the contact suction member 101 against the roll cleaning member 81, or the pressing amount of the roll cleaning member 81 against the contact suction member 101 is changed according to the negative pressure value measured by the pressure sensor 161 during the self-cleaning so as to achieve a predetermined negative pressure value. Alternatively, the controller 50 may perform a feed forward control in which the relative position of the roll cleaning member 81 with respect to the contact suction member 101, the pressing force (pressing amount) of the contact suction member 101 against the roll cleaning member 81, or the pressing amount of the roll cleaning member 81 against the contact suction member 101 is calculated in advance (predicted) from a past result value (e.g., a correlation data between the processing force (pressing amount) of the contact suction member 101 against the roll cleaning member 81 and the negative pressure value or detection results of various disturbances) so as to achieve a predetermined negative pressure value. In an embodiment, the feed forward control and the feedback control may be used in combination.

Meanwhile, when the negative pressure does not become a normal value during the self-cleaning (when step S3 is "NO"), first, the controller 50 stops the suction by the negative pressure generator 160 (step S5). Next, the controller 50 releases the pressing by the arm 90, and moves the upper roll cleaning member 81a to the separation position (step S6). Next, the controller 50 closes the first control valve 163a, opens the second control valve 163b, and switches the connection with the suction pipe 140 to the positive pressure generator 162 (step S7). Then, the controller 50 drives the positive pressure generator 162 to generate a positive pressure in the suction area 100B so as to perform clogging-removal (flushing) of the suction holes 112 (step S8).

That is, when the positive pressure generator 162 is driven and a fluid is introduced into the suction pipe 140, it is possible to cause the fluid to be ejected (flush) from the suction holes 112. It is possible to remove the foreign matter clogged in the suction holes 112 by the ejection of the fluid. At this time, since the upper roll cleaning member 81a is separated from the contact suction member 101, it is possible to suppress the removed foreign matter from adhering to the upper roll cleaning member 81a. When this clogging-removal is performed, the controller 50 closes the second control valve 163b and opens the first control valve 163a so as to switch the connection with the suction pipe 140 to the negative pressure generator 160 (step S9). Then, returning to step S1, the controller 50 moves the upper roll cleaning member 81a located at the separation position to the contact position, and starts self-cleaning again.

Here, in an embodiment, when the negative pressure does not become a normal value during the self-cleaning even after the flushing (when step S3 is "NO"), the controller 50 generates an alarm signal, and activates the load lock function equipped in the negative pressure generator 160 to stop the scrub cleaning of the roll cleaning member 81 on the substrate W and the processing of the self-cleaning apparatus 100 (as shown in step S5). Then, after finalizing steps S6~S8, the scrub-cleaned substrate is unloaded from the housing and stopped from being loaded into another substrate cleaning apparatus.

Thus, according to the third embodiment having the above-described configuration, the self-cleaning apparatus 100 adopts a configuration including a contact suction member 101 having a contact area 100A and a suction area 100B, a negative pressure generator 160 configured to generate a negative pressure in the suction area 100B of the contact suction member 101, a pressure sensor 161 configured to measure the negative pressure, a switching device 160 configured to switch a device connected to the contact suction member 101 between the negative pressure generator 160 and a positive pressure generator 163 configured to generate a positive pressure in the suction area 100B. Therefore, the self-cleaning apparatus 100 is capable of performing self-cleaning of the roll cleaning member 81 while maintaining the self-cleaning apparatus 100 itself. Therefore, it is possible to maintain the roll cleaning member 81 clean, to obtain a high substrate cleaning effect, and to increase the life of the roll cleaning member 81.

While the third embodiment has been described on the basis of the configuration of the second embodiment. The configuration of the first embodiment is also applicable. Specifically, in step S1, the actuator 102 (see FIG. 3) is driven to move the contact suction member 101 to the contact position. In step S6, the pressing by the actuator 102 may be released to move the contact suction member 101 to the separation position.

For example, in the above-described embodiments, the above-described self-cleaning apparatus 100 is applied to the upper roll cleaning member 81a, but may be applied to the lower roll cleaning member 81b. When the lateral space of the lower roll cleaning member 81b is narrow, an apparatus similar to the self-cleaning apparatus 100 of the second embodiment may be provided below the lower roll cleaning member 81b.

For example, in the above-described embodiments, the roll cleaning member 81 is exemplified as the cleaning member. However, for example, the cleaning member may be a pencil type cleaning member (e.g., a column type, conical type, or truncated cone type cleaning member), or may be a belt type cleaning member that runs endlessly.

For example, in the above-described embodiments, an aspect of performing scrub-cleaning in the state in which a substrate W is placed horizontally (horizontal orientation) has been exemplified. However, for example, the scrub-cleaning may be performed in the state in which the substrate W is placed vertically (vertical orientation). Specifically, in the modification in which the substrate W is placed vertically (vertical orientation), the pair of roll cleaning members 81 described above may be disposed to face each other in the horizontal direction. Thus, the above-described "upper roll cleaning member 81a" and "lower roll cleaning member 81b" may be read as a "first roll cleaning member" and a "second roll cleaning member," respectively.

For example, in the above embodiments, the configuration in which the substrate cleaning apparatus of the present disclosure is applied to the cleaning unit 30 of the substrate processing apparatus 1 has been exemplified. However, for example, the present disclosure may be a single cleaning apparatus used for cleaning a substrate, or may also be applied to a cleaning section of an apparatus other than a CMP apparatus (e.g., a rear surface polishing apparatus, a bevel polishing apparatus, an etching apparatus, or a plating apparatus).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cleaning apparatus comprising:
a cleaning body including a cleaning plate attached to a fixing plate, the cleaning plate having a flat contact surface configured to face a cleaning roll and a non-facing surface opposite the flat contact surface, the flat contact surface including a groove formed therein and a plurality of suction holes arranged in a bottom surface of the groove to form a suction area configured to come into contact with the cleaning roll, wherein the cleaning roll is configured to scrub-clean a substrate; and
a suction pipe connected to the fixing plate,
wherein the cleaning plate and the fixing plate form a chamber therebetween, each of the plurality of suction holes penetrates the cleaning plate from the bottom surface of the groove to the non-facing surface of the cleaning plate, wherein the non-facing surface faces the chamber, and the suction pipe is connected to the chamber via a communication hole positioned in the fixing plate,
the suction area is configured to remove foreign matter from the cleaning roll,
the groove extends along a direction parallel to a rotation axis of the cleaning roll in a center of the flat contact surface with respect to a direction orthogonal to the direction parallel to the rotation axis of the cleaning roll, and
an opening edge between the flat contact surface and the groove is rounded.

2. The cleaning apparatus according to claim 1, wherein the cleaning roll is configured to scrub-clean the substrate while rotating the substrate.

3. The cleaning apparatus according to claim 2, wherein the plurality of suction holes are arranged at intervals along the direction parallel to the rotation axis of the cleaning roll.

4. The cleaning apparatus according to claim 3, wherein the groove has a length in the direction parallel to the rotation axis of the cleaning roll, wherein the length is shorter than a length of the cleaning roll along the rotation axis of the cleaning roll.

5. The cleaning apparatus according to claim 3, wherein the groove has a length in the direction parallel to the rotation axis of the cleaning roll, wherein the length is longer than a length of the substrate.

6. The cleaning apparatus according to claim 3, wherein the cleaning roll includes a plurality of protrusions formed on a peripheral surface thereof, and
the groove has a width smaller than a width of each of the protrusions in a direction orthogonal to the rotation axis of the cleaning roll.

7. The cleaning apparatus according to claim 3, wherein the opening edge is formed in a circular arc shape in which an inclination gradually increases toward the bottom surface of the groove in a transversal cross-sectional view across the groove and a longitudinal cross-sectional view through the groove.

8. The cleaning apparatus according to claim 3, wherein the bottom surface of the groove is formed in a circular arc shape in which opening positions of the plurality of suction holes are deepest in a cross-sectional view across the groove.

9. The cleaning apparatus according to claim 1, further comprising:
an actuator including a housing and a shaft, the shaft being configured to relatively move the cleaning roll and the cleaning body between a contact position where the cleaning roll and the cleaning body are in contact with each other and a separation position where the cleaning roll and the cleaning body are separated from each other; and a controller configured to control the actuator, wherein the housing is fixed to an arm, the arm being configured to support the cleaning roll and the cleaning body.

10. The cleaning apparatus according to claim 9, wherein the controller controls the actuator such that the cleaning roll and the cleaning body come into contact with each other at least while the cleaning roll scrub-cleans the substrate.

11. The cleaning apparatus according to claim 1, further comprising:

an actuator configured to relatively move the cleaning roll and the cleaning body between a contact position where the cleaning roll and the cleaning body are in contact with each other and a separation position where the cleaning roll and the cleaning body are separated from each other; and a controller configured to control the actuator, wherein the controller controls the actuator such that the cleaning roll and the cleaning body come into contact with each other at least while the cleaning roll is located at a standby position where the cleaning roll does not scrub-clean the substrate.

12. The cleaning apparatus according to claim 1, further comprising:

a vacuum pump configured to generate a negative pressure in the suction area of the cleaning body;

a positive pressure pump configured to generate a positive pressure in the suction area;

a pressure gauge configured to measure the negative pressure; and a plurality of valves configured to switch a connection to the suction pipe between the vacuum pump and the positive pressure pump based on a measurement result of the pressure gauge.

13. A substrate processing apparatus comprising:

a polisher including a polishing pad configured to polish a substrate; and the cleaning apparatus of claim 1.

14. A method of cleaning comprising:

providing the cleaning apparatus of claim 1;

bringing the cleaning roll of the cleaning apparatus into contact with the cleaning body; and performing suction through the suction area thereby removing foreign matter from the cleaning roll.

15. The method according to claim 14, wherein the cleaning roll is brought into contact with the flat contact surface at least while the cleaning roll scrub-cleans the substrate.

16. The method according to claim 14, wherein the cleaning roll is brought into contact with the flat contact surface at least while the cleaning roll is located at a standby position where the cleaning roll does not scrub-clean the substrate.

17. The method according to claim 14, wherein, when a negative pressure in the suction area is not a normal value, a positive pressure is generated in the suction area.

18. The method according to claim 14, further comprising:

performing a control in which a relative position of the cleaning roll with respect to the flat contact surface, a first pressing amount of the cleaning roll against the flat contact surface, or a second pressing amount of the flat contact surface against the cleaning roll is calculated in advance, and the cleaning roll and the flat contact surface are brought into contact with each other according to the relative position, the first pressing amount, or the second pressing amount calculated in advance.

19. The method according to claim 14, further comprising:

performing a control in which a relative position of the cleaning roll with respect to the flat contact surface, a first pressing amount of the cleaning roll against the flat contact surface, or a second pressing amount of the flat contact surface against the cleaning roll is changed while a nozzle pressure sensor measures a negative pressure value such that the negative pressure measured by the nozzle pressure sensor becomes a preset negative pressure value.

* * * * *